United States Patent
Ferreiro

(10) Patent No.: US 7,564,161 B1
(45) Date of Patent: Jul. 21, 2009

(54) SELF-POWERED CRYSTAL RESONATOR

(75) Inventor: Pablo Ferreiro, Erie, PA (US)

(73) Assignee: Bliley Technologies Inc., Erie, PA (US)

( * ) Notice: Subject to any disclaimer, the term of this patent is extended or adjusted under 35 U.S.C. 154(b) by 109 days.

(21) Appl. No.: 12/001,897

(22) Filed: Dec. 13, 2007

(51) Int. Cl.
*G21H 1/00* (2006.01)
*H01L 41/08* (2006.01)

(52) U.S. Cl. .................................... 310/305
(58) Field of Classification Search .......... 310/302–305
See application file for complete search history.

(56) References Cited

U.S. PATENT DOCUMENTS

| | | | | |
|---|---|---|---|---|
| 3,149,232 A | * | 9/1964 | Jaffe et al. | 250/492.1 |
| 4,282,520 A | * | 8/1981 | Shipp et al. | 340/629 |
| 5,079,469 A | * | 1/1992 | Bongianni | 310/301 |
| 7,301,254 B1 | * | 11/2007 | Lal et al. | 310/309 |
| 2006/0176158 A1 | * | 8/2006 | Fleming | 340/425.5 |
| 2006/0293151 A1 | * | 12/2006 | Rast | 482/8 |
| 2007/0273244 A1 | * | 11/2007 | Lal et al. | 310/311 |

* cited by examiner

*Primary Examiner*—Thomas M Dougherty
(74) *Attorney, Agent, or Firm*—Richard K Thomson

(57) ABSTRACT

A piezoelectric circuit has a base crystal with electroplated electrodes, at least one of which has a beta emitter such as Nickel 63 vacuum plated thereon to provide a self-powering capability. The size of the radioactive power source will be selected to enable the resonator to function without the benefit of an external power source for some applications. In other instances, the radioactive power source will be sized to enable the resonator to produce higher amplitude output to reduce the level of phase noise and improve resolution.

20 Claims, 4 Drawing Sheets

SELF-POWERED CRYSTAL RESONATOR

BACKGROUND AND SUMMARY OF THE INVENTION

The present invention is in the field of electronic devices, especially piezoelectric devices. More particularly, the present invention is directed to a piezoelectric resonator, for example, which is provided with a radioactive power source to, preferably, make it either self-sustaining or to provide it with larger amplitude response.

Significant advances have been made in the area of piezoelectric resonators in recent years. Single crystal quartz resonators, for example, have particularly low phase noise and, when operating at or near resonance, have greatly reduced power requirements. Still, the demanding applications of space travel where the resonator functions as a timing device upon which other electronics rely, even lower phase noise is desirable as well as reducing consumption of external power.

Accordingly, it is an object of the present invention to utilize a radioactive power source, such as a beta emitter (Nickel 63, for example) on at least one of the electrode leads of the piezoelectric resonator to reduce phase noise as well as the external power required. Given the long half-life of this material and the low power required by a single quartz crystal vibrating at resonance, the self-powered crystal resonator of the present invention can meet the extremely rigorous demands of space travel for extended (i.e., 50+ years) space missions on manned and unmanned space vehicles.

Piezoelectric crystal resonators, in addition to having intrinsically high Q factors, have extremely low impedance (i.e., Ohmic resistance) when operating at its resonant frequency. As a result, these resonators are desired for use as RF filters, sensors, timers, etc. When operating at resonance, the piezoelectric crystal will draw current from the radioactive power source. When operating at any other frequency, the power source will saturate the conductors without producing any current flow. In the case of a piezoelectric crystal being used as a transducer with stationary polarity, or in "piezoelectric ceramics or polymers" which exhibit the phenomenon of electrostriction (i.e., induced piezoelectric properties), the electrical flow can be established using different work function metals. However, in the current invention when used with a radioactive power source, the electrostriction materials function like a capacitor accumulating energy from the power source and releasing on demand.

The chief benefit of the present invention is that it removes application restrictions imposed by intrinsic properties of the materials. Prior attempts to solve these limitations include use of very high drive levels for the resonators and certain dual crystal systems which are more complex and have higher power requirements. By using the anisotropic properties of the single quartz crystal, a resultant electrical response can be selected from a variety of electrical responses based on the angle at which the crystal is cut from the blank.

The manufacturing steps for the present resonator include cleaning the cleaning/etching the surface with chemicals to ready the base plate. Then the electrodes, typically gold, silver, platinum or aluminum, are deposited on one of the surfaces using vacuum deposition. At this point, the deposition has reduced the operating frequency by typically 1% from the nominal frequency of the unprocessed resonator. The base plated device can now mounted in its holder, coated with the beta emitter and its operational properties tweaked to the final desired frequency. The beta emitter is applied, most preferably, using vacuum deposition. The resonator is then subjected to a high vacuum or an inert atmosphere and sealed in its housing.

The crystal resonator of the present invention will be designed to operate at its resonant frequency which has the lowest possible impedance for the resonator. Once the initial RF signal is applied to initiate vibration, the radioactive power source can sustain the vibration with some additional amplitude of the output signal. To maintain the oscillation, the RF is returned to the feedback loop of the circuit, and the additional energy (excess amplitude) can be stored for future use or removed from the system. In some instances, the excess amplitude will be allowed to remain in the system to lower the effective phase noise thereof and improve resolution. The radioactive power source can also be tapped by supplemental circuitry to recharge batteries or provide energy to inaccessible power sources. The actual amount of excess energy that can be tapped from the radioactive source will depend on the power density and the existing level at the time of tapping (the most current quasi-constant if a long half-life isotope is used).

The piezoelectric circuit of the present invention comprises a) a piezoelectric resonator; b) electrodes formed on the piezoelectric resonator, the electrodes being used to actuate vibration of the piezoelectric resonator; c) a radioactive power source associated with at least one of the electrodes of the piezoelectric resonator; whereby the piezoelectric circuit requires a reduced external power source. The power source is preferably a radioactive layer which is associated with the at least one electrode and is applied by electroplating or vacuum deposition. Most preferably, the radioactive power source is a beta emitter such as Nickel 63 and the resonator is a quartz crystal. For some applications, the quartz crystal will be associated with an Application Specific Integrated Circuit (ASIC) substrate. In some instances the size of the radioactive power source is selected to make the piezoelectric resonator self-sustaining. In other instances, the size is selected to provide the piezoelectric resonator with a larger amplitude response than it would otherwise be able to obtain.

Various other features, advantages, and characteristics of the present invention will become apparent after a reading of the following detailed description.

BRIEF DESCRIPTION OF THE DRAWINGS

The preferred embodiment(s) of the present invention is/are described in conjunction with the associated drawings in which like features are indicated with like reference numerals and in which.

DETAILED DESCRIPTION OF THE PREFERRED EMBODIMENT(S)

Figure 1:
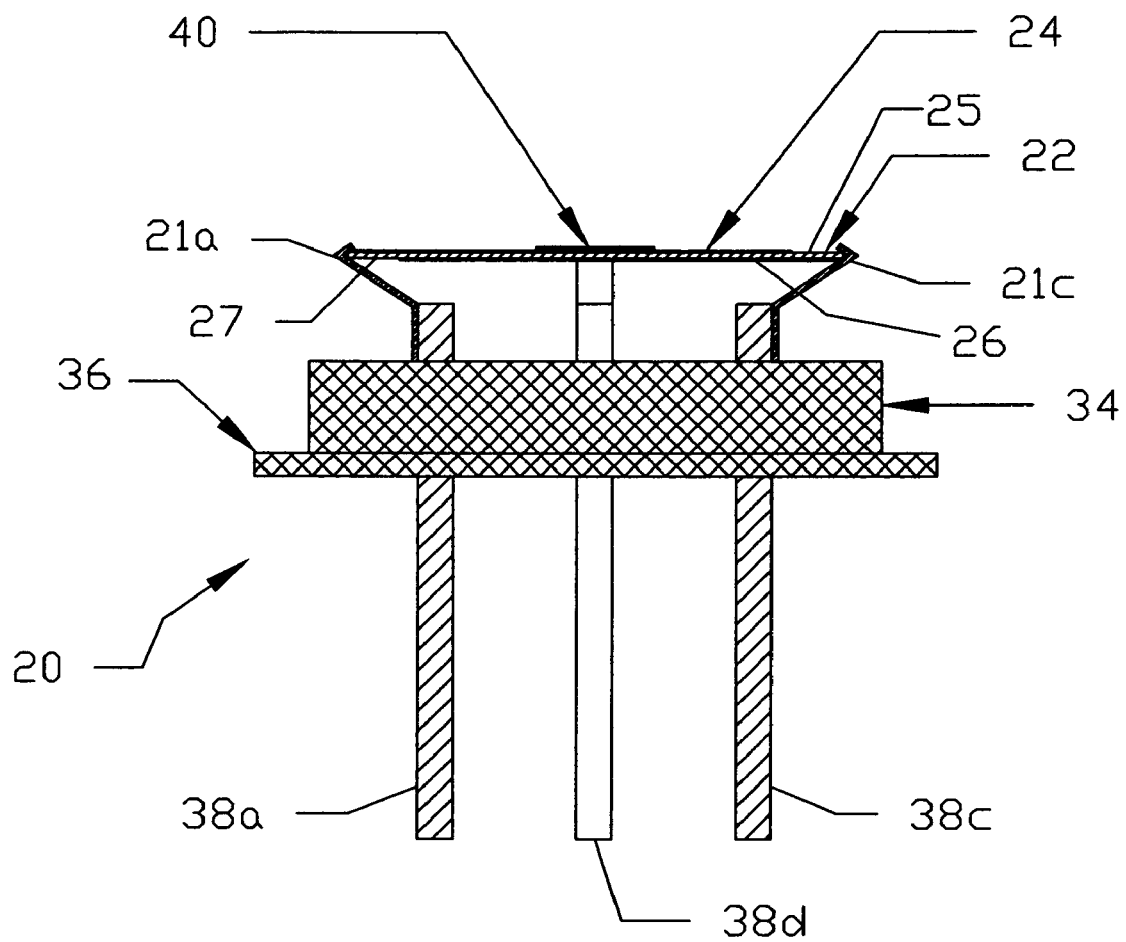
FIG. 1 is a cross-sectional side view of a first embodiment of the piezoelectric circuit of the present invention as seen along line 1-1 in FIG. 3.
Figure 2:
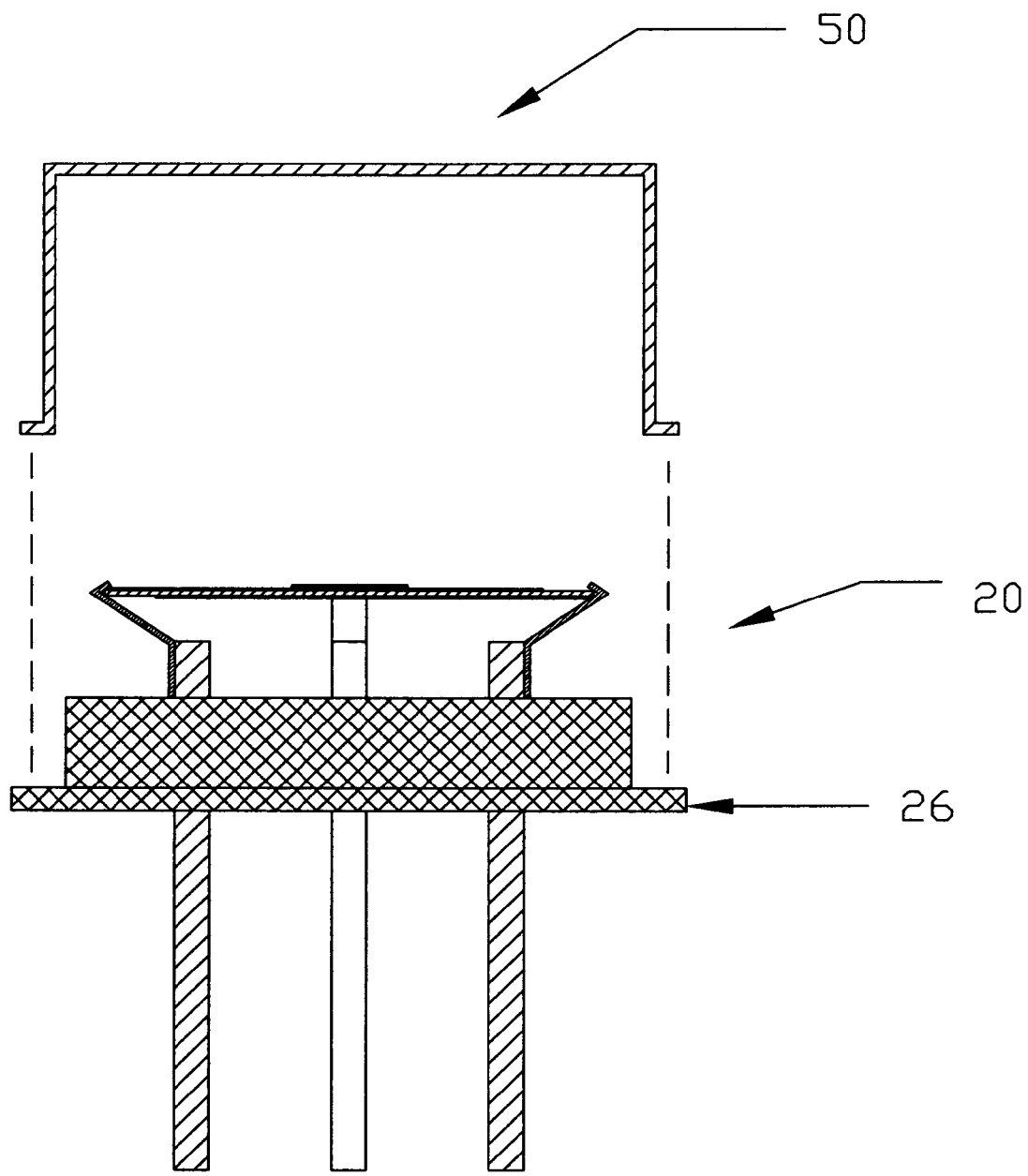
FIG. 2 is an enlarged cross-sectional side view of the first embodiment with a cap.
Figure 3:
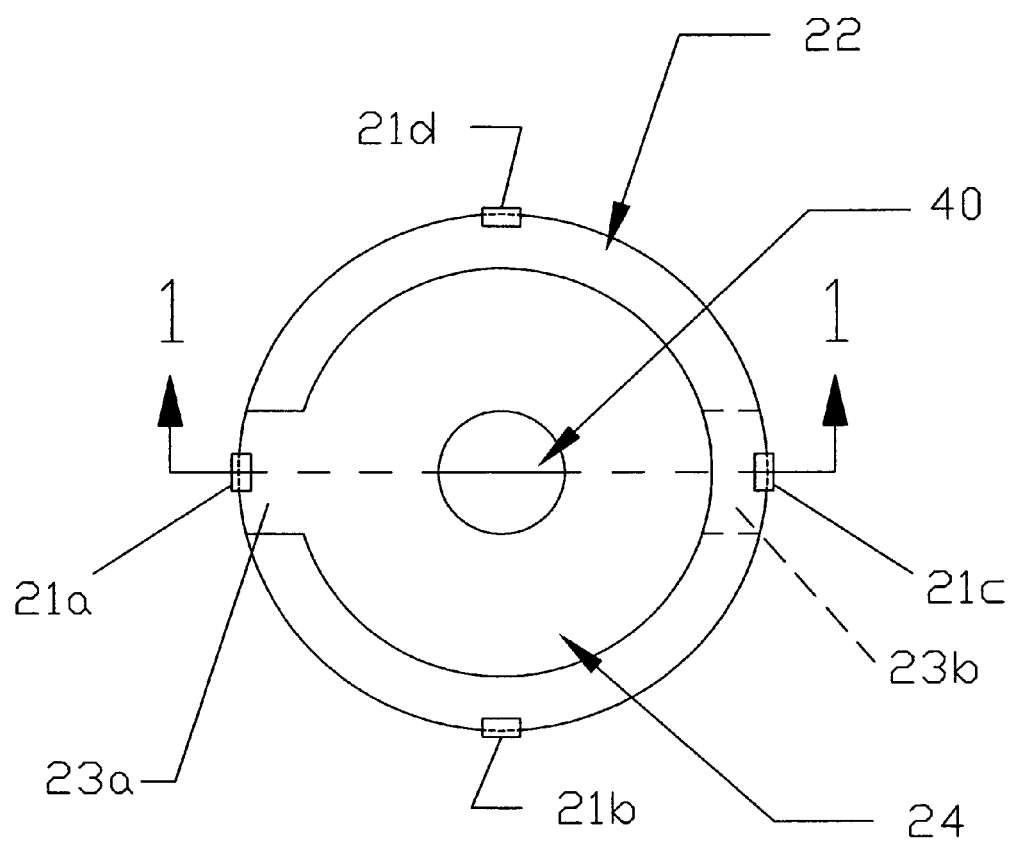
FIG. 3 is a top view of the first embodiment of the piezoelectric circuit of the present invention.

A first embodiment of the piezoelectric circuit of the present invention is shown in FIGS. 1-3 generally at 20. Piezoelectric circuit 20 comprises a piezoelectric oscillator 22 which is preferably a single crystal metallic quartz crystal or equivalent, which is mounted on four metallic support posts 21a-21d. Oscillator 22 has electrode 24 on an upper surface 25 and an electrode 26 on lower surface 27. Electrodes 24 and 26 are preferably precious metals such as gold, silver or platinum, most preferably, gold. These electrodes 24, 26 are typically deposited using electroplating/vacuum deposition techniques. Similar devices and their methods of manufacture are disclosed in commonly assigned U.S. Pat. Nos. 7,061,086 and 7,196,405 which are hereby incorporated by reference. Metallic base 34 and bottom 36 are made of the same metal to ensure like coefficients of expansion. Obviously, base 34 and bottom 36 can made of other materials including ceramic, silicon, etc. Metallic elements 34,36 are coated with glass at points where four electrical contacts 38a, 38b, 38c, 38d pass through in order to ensure electrical isolation. Electrical contact 38a makes contact with a protruding portion 23a (FIG. 3) of upper electrode 24 through support post 21a to complete one half of the piezoelectric circuit. Electrode 38c makes contact with a protruding portion 23b of lower electrode 26 through support post 21c to complete the other half of the circuit.

Figure 4:
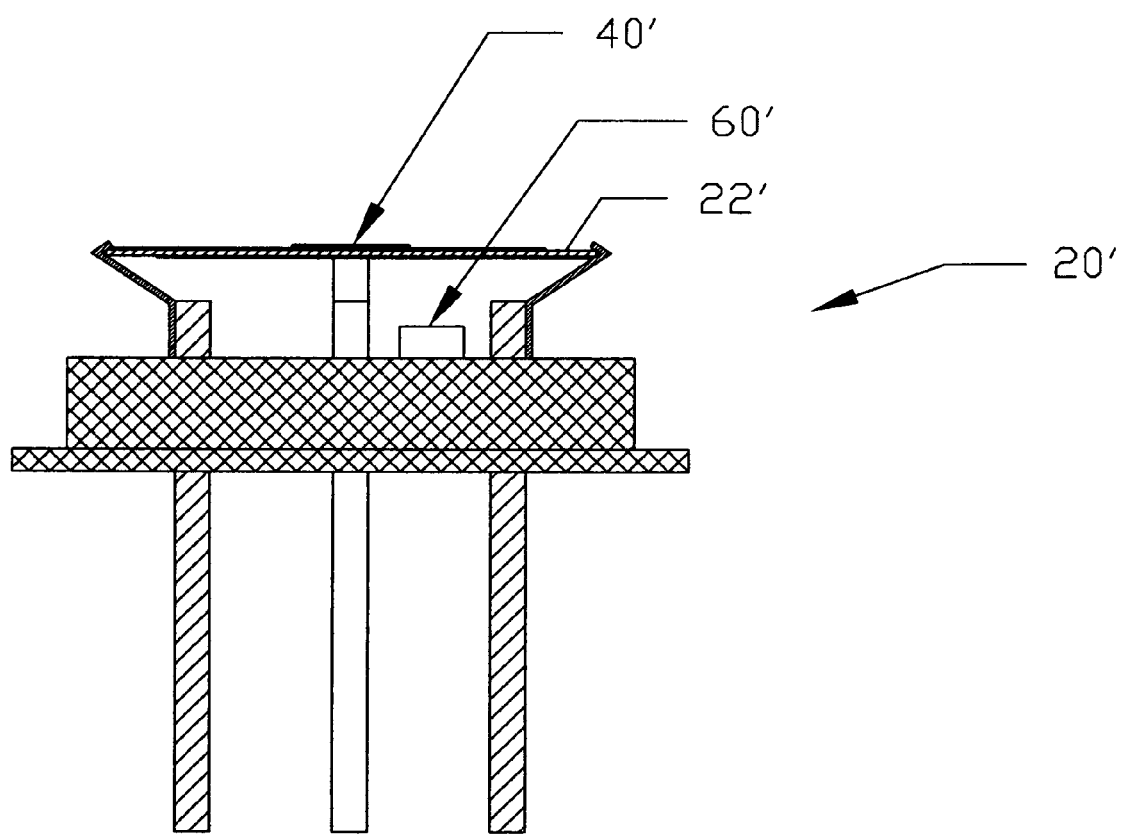
FIG. 4 is a top view of a second embodiment including an application specific integrated circuit (ASIC).

A radioactive layer 40 is affixed to one of the two electrodes 24,26, being shown as attached to upper electrode 24 in FIGS. 1-3 although for some applications, it may be preferred to affix layer 40 to lower electrode 26. Most preferably, layer 40 is affixed by vacuum deposition techniques and is sized to fully power the quartz resonator 22 once it reaches resonance frequency. As depicted in FIGS. 1-3, layer 40 covers a very small portion of electrode 24; obviously, applications will demand a variety of sizes and the size could extend to cover the entirety of the electrode, if needed. When functioning at resonance, the quartz resonator 22 requires minimal power and the radioactive layer 40 can provide the necessary power for indefinite periods, an important consideration for space applications, among others. Radioactive layer 40 will preferably be a beta-emitter of the type provided by Nickel 63 (Ni 63). For other applications, the radioactive layer 40 will be sized to allow the response of piezoelectric resonator 22 to be amplified. As shown in FIG. 2, a cap element 50 will typically be affixed to bottom 36 using thermo-compression bonding means which is performed in a temperature range of between 300° C. and 800° C., most preferably using a brazing technique employing a gold indium eutectic alloy and performed at a temperature of 495° C. The cap element 50 will be secured in a high vacuum chamber (vacuum in a range between $1\times10^{-6}$ and $1\times10^{-10}$ torr) to remove all potential pollutants from the cavity to ensure optimal long term performance by the resonator 22. As shown in a second embodiment depicted in FIG. 4 generally at 20', an application specific integrated circuit (ASIC) 60' may be employed with quartz resonator 22'. Depending on the specific requirements of the piezoelectric circuit 20 [20'], the radioactive power source 40 [40'] can be sized to provide excess power for other related components, either through a capacitive circuit or simply through a hard wire circuit attached to leads 38a-d.

The use of a radioactive power source 40 in piezoelectric circuit 20 will increase the amplitude of the electrical response for the circuit, alter the power density spectrum resulting in the lowest possible phase noise for such devices, reduce the size of the external power source required for initial startup, and provide a long-lasting power source for space applications, and the like. Quartz crystals are preferred for application as the resonator 22 because of its intrinsically high Q factor and its ability to achieve lowest impedance at resonant frequency. This combination or low impedance and a power source with the longevity of an extended radioactive half-life offers performance advantages not currently available.

Various changes, alternatives, and modifications will become apparent to a person of ordinary skill in the art after a reading of the foregoing specification. It is intended that all such changes, alternatives, and modifications as fall within the scope of the appended claims be considered part of the present invention.

I claim:

1. A piezoelectric circuit comprising
   a) a piezoelectric resonator;
   a) electrodes formed on said piezoelectric resonator, said electrodes being used to actuate vibration of said piezoelectric resonator;
   b) a radioactive power source associated with at least one of said electrodes of said piezoelectric resonator;
   whereby said piezoelectric circuit is self-powered requiring a reduced external power source.

2. The piezoelectric circuit of claim 1 wherein said radioactive power source is a radioactive layer which is associated with said at least one of said electrodes of said piezoelectric resonator.

3. The piezoelectric circuit of claim 2 wherein said layer is applied to said at least one electrode by electroplating.

4. The piezoelectric circuit of claim 2 wherein said coating is applied to said at least one electrode by vacuum deposition.

5. The piezoelectric circuit of claim 3 wherein said radioactive power source is a beta-emitter.

6. The piezoelectric circuit of claim 5 wherein said beta-emitter is Nickel 63.

7. The piezoelectric circuit of claim 1 wherein said piezoelectric resonator is a quartz crystal.

8. The piezoelectric circuit of claim 7 wherein said quartz crystal is associated with an Application Specific Integrated Circuit (ASIC) substrate.

9. The piezoelectric circuit of claim 1 wherein a size of said radioactive power source is selected to make said piezoelectric resonator self-sustaining requiring no external power source.

10. The piezoelectric circuit of claim 1 wherein a size of said radioactive power source is selected to provide said piezoelectric resonator with a larger amplitude response.

11. A self-powered crystal resonator comprising
    a) a piezoelectric resonator;
    b) at least one pair of electrodes affixed to said piezoelectric resonator;
    c) a radioactive power source associated with at least one of said pair of electrodes of said piezoelectric resonator;
    whereby said crystal resonator is self-powered requiring a smaller external power source.

12. The self-powered crystal resonator of claim 11 wherein said radioactive power source is a radioactive layer which is associated with said at least one of said pair of electrodes of said piezoelectric resonator.

13. The self-powered crystal resonator of claim 12 wherein said layer is applied to said at least one electrodes by electroplating.

14. The self-powered crystal resonator of claim 12 wherein said coating is applied to said at least one electrode by vacuum deposition.

15. The self-powered crystal resonator of claim 13 wherein said radioactive power source is a beta-emitter.

16. The self-powered crystal resonator of claim 5 wherein said beta-emitter is Nickel 63.

17. The self-powered crystal resonator of claim 11 wherein said piezoelectric resonator is a quartz crystal.

18. The self-powered crystal resonator of claim 17 wherein said quartz crystal is associated with an Application Specific Integrated Circuit (ASIC) substrate.

19. The self-powered crystal resonator of claim 11 wherein a size of said radioactive power source is selected to make said piezoelectric resonator self-sustaining requiring no external power source.

20. The self-powered crystal resonator of claim 11 wherein a size of said radioactive power source is selected to provide said piezoelectric resonator with a larger amplitude response.

* * * * *